United States Patent

Van Damme et al.

[11] Patent Number: 5,851,724
[45] Date of Patent: *Dec. 22, 1998

[54] METHOD FOR PRODUCING LITHOGRAPHIC PLATES WITH IMAGING ELEMENTS COMPRISING A PHOTOSENSITIVE ACID PRECURSOR

[75] Inventors: Marc Van Damme, Heverlee; Joan Vermeersch, Deinze; Etienne Schacht, Staden; Stefan Vansteenkiste, De Pinte, all of Belgium

[73] Assignee: Agfa-Gevaert, N.V., Mortsel, Belgium

[ * ] Notice: The term of this patent shall not extend beyond the expiration date of Pat. No. 5,624,785.

[21] Appl. No.: 521,045

[22] Filed: Aug. 29, 1995

[30] Foreign Application Priority Data

Sep. 8, 1997 [EP] European Pat. Off. .............. 94202581

[51] Int. Cl.$^6$ ................................. G03F 7/34; G03F 7/11
[52] U.S. Cl. ...................... 430/253; 430/258; 430/273.1; 430/278.1; 430/302
[58] Field of Search ..................... 430/258, 253, 430/306, 302, 273.1, 278.1

[56] References Cited

U.S. PATENT DOCUMENTS

| | | | |
|---|---|---|---|
| 4,210,711 | 7/1980 | Kitajima et al. | 430/253 |
| 4,291,114 | 9/1981 | Berggren et al. | 430/253 |
| 4,334,006 | 6/1982 | Kitajima et al. | 430/254 |
| 4,396,700 | 8/1983 | Kitajima et al. | 430/254 |
| 4,511,641 | 4/1985 | Busman et al. | 430/158 |
| 4,554,238 | 11/1985 | Bushman | 430/258 |
| 5,135,838 | 8/1992 | Houlihan et al. | 430/270.1 |
| 5,272,035 | 12/1993 | Sekiya | 430/302 |
| 5,407,764 | 4/1995 | Cheema et al. | 403/253 |
| 5,624,785 | 4/1997 | Van Damme et al. | 430/253 |
| 5,674,658 | 10/1997 | Burberry et al. | 430/253 |

*Primary Examiner*—John S. Chu
*Attorney, Agent, or Firm*—Breiner & Breiner

[57] ABSTRACT

The present invention provides a method for obtaining a lithographic printing plate comprising the steps of: (a) image-wise or information-wise exposing a photosensitive imaging element comprising on a hydrophilic surface of a support a hydrophobic photosensitive layer contiguous to said hydrophilic surface, comprising (i) a photosensitive acid precursor and (ii) a hydrophobic polymeric binder and (b) developing said exposed imaging element by the steps of: (i) laminating before or after said exposure an uppermost layer of said imaging element to a receptor layer and (ii) peeling away the receptor layer from the hydrophilic surface of the support thus transferring said hydrophobic photosensitive composition patternwise to the receptor layer, characterized in that said hydrophobic photosensitive layer comprises as photosensitive acid precursor a non-ionic photosensitive precursor of a sulphonic acid or a non-ionic photosensitive precursor of an optionally partially esterified phosphonic acid or a non-ionic photosensitive precursor of an optionally partially esterified phosphoric acid, the latter phosphonic or phosphoric acid precursors in the absence of an acid-sensitive composition of (a) low molecular weight compound(s).

10 Claims, No Drawings

METHOD FOR PRODUCING LITHOGRAPHIC PLATES WITH IMAGING ELEMENTS COMPRISING A PHOTOSENSITIVE ACID PRECURSOR

DESCRIPTION

1. Field of the Invention.

The present invention relates to a photosensitive imaging element comprising a photosensitive acid precursor and a hydrophobic polymeric binder and to a method for the formation of lithographic printing plates therewith.

2. Background of the Invention.

The use of photosensitive imaging elements comprising a photosensitive acid precursor and an acid-sensitive composition for the production of images by information-wise exposure thereof to actinic radiation is well known. Almost all these materials are based on the principle of introducing a differentiation in solubility between the exposed and non-exposed parts of the acid-sensitive composition. The thus produced difference in solubility may be subsequently employed in a developing step to produce a visible image.

A difference in solubility between the exposed and non-exposed parts of the acid-sensitive composition is often used for the production of lithographic printing plates where a hydrophilic base is coated with the acid-sensitive composition, subsequently exposed and developed using a solvent, in general an aqueous solution to remove patternwise the acid-sensitive composition. When the photogenerated acid enhances the solubility of the acid-sensitive composition in the solvent used. The sufficiently exposed areas of the imaging element are removed during the development and the process is positive working. The process can be negative working as well when the photogenerated acid diminishes the solubility of the acid-sensitive composition in the solvent used, the non-exposed or insufficiently exposed parts of the imaging element then being removed during the development. Such a process is for example described in "Unconventional imaging processes" by E. Brinckman, G. Delzenne, A. Poot and J. Willems, Focal Press London-New York, first edition 1978, pages 88 to 91.

The use of a difference in tackiness to obtain an image is described in e.g. U.S. Pat. No. 4,810,601. According to the method disclosed in this US patent the image-wise exposed acid-sensitive composition becomes, after heating, tacky in the exposed parts while the non-exposed parts remains non-tacky. The exposed parts can therefore be colored with absorbing dyes to make the image visible.

The development of photosensitive imaging elements comprising a photosensitive acid precursor and an acid-sensitive composition and based on the principle of introducing a differentiation in solubility between the exposed and non-exposed parts of the acid-sensitive composition requires in most cases the use of an aqueous developer. This is a cumbersome and inherently dangerous operation for the user of said imaging elements due to the possible contact with said hazardous aqueous developer.

Moreover, the developed imaged elements need a further rinsing after the development step so that a sizeable amount of diluted aqueous waste is produced during the processing of said imaging elements, being an ecological and economical disadvantage for said process.

GB-A 2,009,436 and 2,009,955 however disclose a process of forming an image, which comprises (a) imagewise exposing a photosensitive image-forming material composed of a support and a layer of a thermoplastic photosensitive composition, said photosensitive composition comprising specified photosensitive acid precursors, (b) placing the exposed photosensitive material with said layer in intimate contact with a peeling development carrier sheet, at least one surface of which is composed of a thermoplastic material, and heating the assembly to a temperature above the softening temperature of at least one of the photosensitive composition layer and the peeling development carrier sheet, and then (c) peeling the development carrier sheet from the photosensitive image forming material at a temperature which is the same as or less than said heating temperature, thereby to leave the exposed or unexposed area of the photosensitive composition layer on the peeling development carrier sheet, and the corresponding unexposed or exposed area on the support.

However, the specified photosensitive acid precursors are thermally unstable (diazo compounds) or ecologically harmful (organic polyhalogen compounds) compounds.

3. Summary of the Invention.

It is an object of the present invention to provide a method for obtaining a lithographic printing plate of a high quality using a photosensitive imaging element comprising a photosensitive acid precursor and a hydrophobic polymeric binder by a dry-developing step wherein said photosensitive acid precursor is a thermally stable and ecologically acceptable compound.

It is another object of the present invention to provide a method for obtaining a lithographic printing plate using said photosensitive imaging element in a convenient way, offering economical and ecological advantages.

Further objects of the present invention will become clear from the description hereinafter.

According to the present invention there is provided a method for obtaining a lithographic printing plate comprising the steps of: (a) image-wise or information-wise exposing a photosensitive imaging element comprising on a hydrophilic surface of a support a hydrophobic photosensitive layer contiguous to said hydrophilic surface, comprising (i) a photosensitive acid precursor and (ii) a hydrophobic polymeric binder and (b) developing said exposed imaging element by the steps of: (i) laminating before or after said exposure an uppermost layer of said imaging element to a receptor layer and (ii) peeling away the receptor layer from the hydrophilic surface of the support thus transferring said hydrophobic photosensitive composition patternwise to the receptor layer, characterized in that said hydrophobic photosensitive layer comprises as photosensitive acid precursor a non-ionic photosensitive precursor of a sulphonic acid or a non-ionic photosensitive precursor of an optionally partially esterified phosphonic acid or a non-ionic photosensitive precursor of an optionally partially esterified phosphoric acid, the latter phosphonic or phosphoric acid precursors in the absence of an acid-sensitive composition of (a) low molecular weight compound(s).

4. Detailed Description of the Invention.

It has been found that lithographic printing plates can be obtained according to the method of the present invention using an imaging element comprising on a hydrophilic base a hydrophobic photosensitive layer containing a hydrophobic polymeric binder and a photosensitive acid precursor as described above by using a dry-developing step. More precisely it has been found that said printing plates are of high quality, contains no thermally unstable or ecologically harmful compounds and are provided in a convenient way, thereby offering economical and ecological advantages.

Preferred non-ionic photosensitive precursors of a sulphonic acid are represented by iminosulfonate as described in *Polymer Preprints* Japan, by M. Tunooka et al, 35 (8), by disulfon compounds described in JP-Pi 61-166544, by α-sulphonyloxy ketones, by α-hydroxymethylbenzoine sulphonates, by o-nitrobenzyl sulphonates, by α-sulphonyl acetophenones and by sulphonyl imides, the preparation of these compounds being well known in the literature.

Preferred non-ionic photosensitive precursors of optionally partially esterified phosphonic acids or of optionally partially esterified phosphoric acids are derivatives of optionally partially esterified phosphonic acid or optionally partially esterified phosphoric acid containing as photosensitive group a o-nitrobenzylgroup, a 1-(2-nitrophenyl) ethylgroup, a benzoinegroup, a 3,5-dimethoxybenzoinegroup, phosphonic acid esters or phosphoric acid esters of pyrenemethanol, iminophosphonates or iminophosphates and imidophosphonates or imidophosphates, the preparation of these compounds being well known in the literature.

Acid-sensitive compositions of (a) low molecular weight compounds in accordance with the invention are monomers capable of undergoing cationic polymerization which are well known to one skilled in the art, a compound with at least two hydroxyl groups and a reagent which is capable of crosslinking under the influence of an acid said compound with at least two hydroxyl groups and a compound comprising at least two latent or masked electrophilic groups that are transformed into electrophilic groups upon reaction with acid and a compound containing an aromatic moiety that is susceptible to electrophilic aromatic substitution.

Most preferably, the photosensitive acid precursors used in connection with the present invention are o-nitrobenzyl phosphonates, o-nitrobenzyl phosphates and o-nitrobenzyl sulphonates.

The support of the imaging element according to the present invention has a hydrophilic surface and should be stable at the processing conditions.

Said support with a hydrophilic surface may be a metallic support e.g. a grained and anodized aluminium support.

More preferably, said support with a hydrophilic surface comprises a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199.

A particularly suitable hydrophilic layer is a layer of polyvinyl alcohol hardened with tetramethylorthosilicate or tetraethylorthosilicate containing $TiO_2$, wherein the weight ratio between said polyvinylalcohol and said tetramethylorthosilicate or tetraethylorthosilicate is between 0.8 and 2 and wherein the weight ratio between said polyvinylalcohol and said titaniumdioxide is preferably not higher than 1.

The above mentioned flexible supports may be opaque or transparent, e.g. a paper support or resin support. When a paper support is used preference is given to one coated at one or both sides with an Alpha-olefin polymer, e.g. a polyethylene layer which optionally contains an antihalation dye or pigment. It is also possible to use an organic resin support e.g. cellulose esters such as cellulose acetate, cellulose propionate and cellulose butyrate; polyesters such as poly(ethylene terephthalate); polyvinyl acetals, polystyrene, polycarbonates; polyvinylchloride or poly-Alpha-olefins such as polyethylene or polypropylene.

One or more subbing layers may be coated between the flexible hydrophobic support and the hydrophilic layer for use in accordance with the present invention in order to get an improved adhesion between these two layers.

A preferred subbing layer for use in connection with the present invention, is a subbing layer which is contiguous to the hydrophilic layer and contains gelatin and silica.

According to the present invention the imaging element comprises on the hydrophilic surface of the support and contiguous thereto a hydrophobic photosensitive layer comprising at least one photosensitive acid precursor and at least one hydrophobic polymeric binder.

According to a preferred mode of the present invention the photosensitive acid precursors are comprised in a hydrophobic thermoplastic layer comprising a hydrophobic thermoplastic polymer.

Said thermoplastic layer is preferably solid at temperatures below 40° C. and is after image-wise exposure patternwise transferable at temperatures between 40° C. and 250° C.

Suitable hydrophobic thermoplastic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Polyacrylate and alpha-alkyl polyacrylate esters, e.g. polymethyl methacrylate and polyvinyl acetate;

(K) High molecular weight polyethylene oxides of polyglycols having average molecular weights from about 4,000 to 1,000.000;

(L) Polyvinyl chloride and copolymers, e.g. polyvinyl chloride/acetate, polyvinylchloride/acetate/alkohol;

(M) Polyvinyl acetal, e.g. polyvinyl butyral, polyvinyl formal;

(N) Polyformaldehydes;

(O) Polyurethanes and copolymers;

(P) Polycarbonate and copolymers;

(Q) Polystyrenes and copolymers e.g. polystyrene/acrylonitrile, polystyrene/acrylonitrile/butadiene.

Preferably, the hydrophobic thermoplastic polymers used in connection with the present invention are copolymers of styrene, more preferably copolymers of styrene and (meth) acrylates, most preferably copolymers of styrene and butyl methacrylate.

The photosensitive layer used in accordance with the present invention is preferably coated in a range from 0.30 g/m$^2$ to 5.00 g/m$^2$, more preferably in a range from 1.00 g/m$^2$ to 3.50 g/m$^2$. The weight ratio of the photosensitive acid precursor to the polymeric binder in said layer preferably ranges from 5% to 40%, more preferably from 8% to 30%.

In general, the photosensitive layer used in accordance with the present invention also comprises at least one spectral sensitizer in order to sensitize said photosensitive layer to a wavelength region longer than far ultraviolet in which a photosensitive acid precursor used has no absorption.

Preferred spectral sensitizers include benzophenone, p,p'-tetraethylmethyldiaminobenzophenone, p,p'-tetraethylethylaminobenzophenone, thio-xanthone, 2-chlorothio-xanthone, anthrone, 9-ethoxyanthracene. anthracene, pyrene, perylene, phenothiazine, benzil, acridine orange, benzoflavin, Setoflavin-T, 9,10-diphenylanthracene, 9-fluorenone, actophenone, phenathrene, 2-nitrofluorene, 5-nitroacenaphthene, benzoquinone, 2chloro-4-nitro-aniline, N-acyl-p-nitroaniline, p-nitroaniline, N-acyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis-(5, 7-dimethoxycarbonylcoumarin) and coronene.

To the hydrophobic photosensitive layer there can also be added non-thermoplastic polymeric compounds to give certain desirable characteristics, e.g. to improve adhesion to said hydrophilic surface of the support used in accordance with the present invention, wear properties, chemical inertness, etc. Suitable non-thermoplastic polymeric compounds include cellulose, phenolic resins, melamineformaldehyde resins, etc. If desired, the hydrophobic photosensitive layer can also contain immiscible polymeric or non-polymeric organic or inorganic fillers or reinforcing agents which are essentially transparent at the wave-lengths used for the exposure of the photosensitive imaging element, e.g. organophilic silicas, bentonites, silica, powdered glass, colloidal carbon, as well as various types of dyes and pigments in amounts varying with the desired properties of the hydrophobic photosensitive layer. The fillers are useful in improving the strength of the composition, reducing tack and in addition, as coloring agents.

Agents to improve the wetting and/or adjust the adhesion of the hydrophobic photosensitive layer may be added. Suitable agents are e.g. silicons, silicon containing polymers e.g. a poly(dimethylsiloxane)-polyether copolymer, poly (dimethylsiloxane) polyester, silicon containing surfactants, fluor containing copolymers and fluor containing surfactants etc.

Various dyes, pigments, thermographic compounds, UV-absorbers, anti-oxidants and color forming components as disclosed in EP-A 522,616 can be added to the photosensitive layer to give a variety of images after the processing. These additive materials should however preferably not absorb excessive amounts of light at the exposure wavelength or inhibit the acid generating reaction.

The imaging element may comprise a temporary protective layer on top of the photopolymerizable composition, preferably a cellulose triacetate or polyethylene terephtalate film base coated with a hydrophilic release layer e.g. polyvinyl alcohol. Said temporary layer should be removed before or after the photo-exposure step but before the processing steps.

Preferably, the photosensitive imaging element comprises on top of the photosensitive layer one or more protective layers selected from the group consisting of (i) a transfer layer which is capable of adhering to a receptor layer and (ii) a receptor layer which is capable of adhering to the underlying contiguous layer and which is upperlying said transfer layer if the latter is present.

Said receptor layer is preferably stable at the processing conditions. The particular layer used is dependent on the nature of the composition of the imaging element. Suitable receptor layers include paper; cardboard; metal sheets; foils and meshes e.g. aluminium, copper, steel, bronze etc.; transparent organic resins e.g. cellulose esters such as cellulose acetate, cellulose propionate and cellulose butyrate, polyvinyl acetals, polystyrene, polycarbonate or polyvinylchloride; opaque foamed or pigmented polyester; silk; cotton and viscose rayon fabrics or screens. Preferred receptor layers are commercially available paper brands as disclosed in EP-A 93201858.3 which therefor is incorporated herein by reference and films or coatings of polyesters such as polyethylene terephthalate or of poly-Alpha-olefins such as polyethylene or polypropylene.

Optionally, a receptor layer is part of a receptor element. A receptor element for use in accordance with the invention comprises at least a receptor layer as an outside layer.

In one embodiment, said receptor element comprises as the receptor layer one of the receptor layers mentioned before and further a thin additional layer. Examples are supports provided with a thin metal layer e.g. polyester supports provided with a vapour deposited metal layer and most useful polyethylene coated paper. Said receptor element may also comprise (a) additional layer(s) such as (a) backing layer(s).

A transfer layer, which is capable of adhering to a receptor layer may be a thermo-adhesive layer or a pressure-adhesive layer.

Suitable thermo-adhesive layers (TALs) for use in the present invention may have a glas transition temperature $T_g$ between 10° C. and 100° C. as measured with the 1090 THERMOANALYZER of Du Pont Co. During the lamination and delamination step a minimal thermal load should be imposed to the material in order to save energy and diminish the risk for material change or deformation. For these reasons the $T_g$ of the TAL is preferably below 60° C. The $T_g$ value of the TAL can be determined by the $T_g$ value of the polymer(s) used and/or by the addition of polymeric or low-molecular plasticizers or thermosolvents.

The adherance of the TAL to the receptor layer is also determined by the flow properties of the TAL while heating above the $T_g$. A parameter for describing this property is the melt viscosity. Preferably a TAL for use in accordance with the present invention has a melt viscosity of more than 3000 Poise measured at 120° C. with the VISCOELASTIC MELT TESTER of Rheometrics Co, Surrey, UK.

In order to induce easy film formation without unwanted sticking of the TAL to the backside of the imaging medium or to other materials a TAL is preferably used with a $T_g$ value between 20° C. and 45° C., a melt viscosity greater than 7000 Poise and an elasticity corresponding to a tg $\delta^{-1}$ value greater than 1.30 measured at 120° C. with the VISCOELASTIC MELT TESTER of Rheometrics Co, Surrey, UK. The tg $\delta^{-1}$ value is a measure for the elasticity as described in "Polymer Chemistry: the Basic Concept" by P. C. Hiemenz, 1984, edit. by M. Dekker Inc., New York.

For ecological and practical reasons the TAL is preferably coated from an aqueous medium. Therefore the polymers are preferably incorporated as latices.

Preferred latices are latices of styrene, styrene-butadiene, styrene-(meth)acrylate and n.butylacrylate-methylmethacrylate-acrylonitrile. These latices can contain other comonomers which improve the stablitity of the latex, such as acrylic acid, methacrylic acid and acrylamide. Other possible latices are disclosed in EP-A 92203188.3, which therefor is incorporated herein by reference.

Particularly suitable polymers for use in the TAL layer are the BAYSTAL polymer types, marketed by Bayer AG, Germany, which are on the basis of styrene-butadiene copolymers with a weight ratio between 40/60 and 80/20. If desired a few weight % (up to about 10%) of acrylamide and/or acrylic acid can be included. Other useful polymers are the EUDERM polymers, also from Bayer AG, which are copolymers comprising n.-butylacrylate, methylmethacrylate, acrylonitrile and small amounts of methacrylic acid.

Various additives can be present in the TAL to improve the layer formation or the layer properties, e.g. thickening agents, surfactants, levelling agents, thermal solvents and pigments.

Apart from an upper thermo-adhesive layer which should preferably comply with the requirements described above the material can contain one or more supplementary thermo-adhesive layer(s) positioned between the upper TAL and the hydrophobic photosensitive layer e.g. to optimize the adherance to the hydrophobic photosensitive layer in view of obtaining a better image quality after the delamination process. This (these) other TAL(s) can have a composition and/or physical properties different from those imposed to the upper TAL. This (these) layer(s) can contain one polymer or a mixture of polymers, optionally in combination with low-molecular additives like plasticizers or thermosolvents. Other ingredients which can be incorporated include waxes, fillers, polymer beads, glass beads, silica etc.

Suitable pressure-adhesive layers (PALs) for use in the present invention comprise one or more pressure sensitive adhesives. Said pressure sensitive adhesives are preferably tacky elastomers e.g. block copolymers of styrene/isoprene, styrene/butadiene rubbers, butyl rubbers, polymers of isobutylene and silicones. Particularly preferred are natural rubbers and acrylate copolymers as disclosed in U.S. Pat. No. 3,857,731. The used pressure sensitive adhesive preferably has a continuous-coat (100% coverage) peel adhesion value, when applied to untreated paper, between 1 and 10 N/cm width, more preferably between 2 and 7 N/cm width.

The pressure-adhesive layer comprising a pressure sensitive adhesive may contain a binder. Suitable binders for use in combination with the pressure sensitive adhesives are binders that are inert towards the pressure sensitive adhesives i.e. they do not chemically attack the pressure sensitive adhesives or act as a solvent for them. Examples of such binders are nitrocellulose, urethanes, gelatin, polyvinyl alcohol etc.

The amount of binder should be chosen such that the pressure sensitive adhesives are effectively anchored to the hydrophobic photosensitive layer. Preferably the amount of binder is lower than 2.5 parts by weight with respect to the pressure sensitive adhesives and more preferably lower than 0.6.

The pressure-adhesive layer comprising a pressure sensitive adhesive may also contain a tackyfier e.g. rosin soap or a terpene.

The imaging element containing a pressure-adhesive layer comprises preferably also a receptor layer on top of said pressure-adhesive layer. In general said receptor layer is (are) (a) transparent layer(s) contiguous to said pressure-adhesive layer e.g. a transparent organic resin layer.

The thickness of the thermo-adhesive or pressure-adhesive transfer layer is important for the adherence of said layers to the photosensitive layer. Preferably the thickness of said transfer layers lie between 0.1 and 30 $\mu$m, more preferably between 1 and 15 $\mu$m.

The imaging element may be prepared by coating the layers on each other and/or by laminating layers or packets of layers to each other.

In a practical embodiment the imaging element is prepared by the following steps:
coating on a support with a hydrophilic surface in accordance with the present invention (i) a hydrophobic photosensitive layer comprising a photosensitive acid precursor and a hydrophobic polymeric binder and (ii) a thermo-adhesive layer with optionally an underlying pressure-adhesive layer.

In another practical embodiment the imaging element is prepared by laminating the above described imaging element with its thermo-adhesive layer onto a receptor layer or onto a pressure-adhesive layer coated on a receptor layer.

In still another practical embodiment the imaging element is prepared by the following steps:
coating on a hydrophilic surface of a support in accordance with the present invention a hydrophobic photosensitive layer comprising a photosensitive acid precursor and a hydrophobic polymeric binder and
laminating the element thus formed with its hydrophobic photosensitive layer onto a receptor layer or onto a pressure-adhesive or thermo-adhesive layer coated on a receptor layer.

According to the method of the present invention for obtaining an image an imaging element according to the present invention is image-wise or information-wise exposed to actinic radiation to change the adhesion properties of the hydrophobic photosensitive layer pattern-wise. The exposure can be a contact exposure using e.g ultraviolet radiation, a camera exposure, a scanning exposure, or a laser exposure. The radiation source used in carrying out the exposure step includes e.g. sunlight, incandescent lamps, mercury vapour lamps, halogen lamps, xenon lamps, fluorescent lamps, light-emitting diodes, lasers, electron rays, and X-rays.

Said exposure can be made through the front side or the back side of the imaging element. It goes without saying that for an exposure through the back the support has to be transparent for the radiation used for the exposure of the photoposensitive imaging element where for a front side exposure any protective layer, if presents has to be transparent for said radiation. Preferably the imaging element is exposed through the front side.

Subsequent to the image-wise or information-wise exposure an image is obtained by (i) laminating before or after said exposure an uppermost layer of said imaging element to a receptor layer and (ii) peeling away the receptor layer from the hydrophilic surface of the support thus transferring said hydrophobic photosensitive layer pattern-wise to the receptor layer and uncovering the image comprised of the hydrophilic surface of the support and the retained hydrophobic photosensitive layer.

When the imaging element does not comprises a protective layer, the receptor element can comprise as receptor layer a thermo-adhesive layer or a pressure-adhesive layer. Also a subbing layer can serve as a receptor layer.

When the imaging element or the receptor element does not comprise a pressure-adhesive layer said laminating is effected by means of a heating step, preferably at a temperature between 25° C. and 180° C., more preferably at a temperature between 65° C. and 120° C. Said heating may be applied to either or both the hydrophilic base and the receptor layer before, while or after bringing the receptor layer in contact with the uppermost layer of the imaging element. A higher temperature results in a higher sensitivity probably due to a better pattern-wise adherance of the receptor layer to the imaging element.

With an imaging element according to the present invention comprising as a transfer layer in the imaging element a thermo-adhesive layer different kinds of cheap plain paper can be applied as receptor layer. A broad range of commercial papers with diverging physical properties can be used.

When the imaging element or the receptor element comprises a pressure-adhesive layer, said laminating requires a pressure step. Said pressure is applied while the receptor layer is in contact with the uppermost layer of the imaging element.

An imaging element and a receptor layer, optionally a receptor element may be brought in contact before exposure. In such embodiment it is required that either the back of the imaging element and/or preferably the receptor layer or the optional receptor element is transparent for the radiation used for the exposure of the photopolymerizable composition.

It may be advantageous to overall expose the image to light and/or heat to enhance its stability. Such a procedure is especially preferred when the image is used as a printing master as described below to improve the scratch resistance of the image.

Because the imaging element according to the present invention comprises a hydrophobic photosensitive layer on a hydrophilic base, the obtained image can be used as a lithographic printing plate. Pattern-wise transfer of the photosensitive layer to a receptor layer and peeling away the receptor layer from the hydrophilic surface of the support results in an image-wise differentiation between hydrophilic and hydrophobic parts that can be used to print with an oily or greasy ink. The hydrophobic parts will be capable of accepting lithographic ink, whereas the hydrophilic areas, when moistened with water, will not accept the ink. The areas which accept ink form the printing image areas and the ink-rejecting areas form the background areas.

The imaging element can be either positive working or negative working depending mainly on the weight ratio in the hydrophobic photosensitive layer between photosensitive acid precursor and hydrophobic (thermoplastic) polymer. Although said ratio is influenced by i.a. the nature of the photosensitive acid precursor and the hydrophobic (thermoplastic) polymer, the weight ratio of a given photosensitive acid precursor to a given hydrophobic polymeric binder in said layer is higher for a negative working system than for a positive working system.

In a negative working imaging element (i.e. where a reversal of the original image occurs) according to the present invention the information-wise exposure to actinic radiation increases the adhesion of the hydrophobic photosensitive layer to the hydrophilic surface of the support pattern-wise in correspondence to the information-wise distribution of actinic radiation. In this case the unexposed or insufficiently exposed areas of the hydrophobic photosensitive layer adheres to the receptor layer when peeling away the receptor layer from the hydrophilic surface of the support, uncovering the lithographic printing plate comprised of the hydrophilic surface of the support and the retained sufficiently exposed areas of the hydrophobic photosensitive layer.

In a positive working imaging element (i.e. where no reversal of the original image occurs) according to the present invention the information-wise exposure to actinic radiation decreases the adhesion of the hydrophobic photosensitive layer to the hydrophilic surface of the support pattern-wise in correspondence to the information-wise distribution of actinic radiation. In this case the sufficiently exposed areas of the hydrophobic photosensitive layer adheres to the receptor layer when peeling away the receptor layer from the hydrophilic surface of the support, uncovering the lithographic printing plate comprised of the hydrophilic surface of the support and the retained unexposed or insufficiently exposed areas of the hydrophobic photosensitive layer.

The following examples illustrate the present invention without limiting it thereto. All percentages are by weight unless stated otherwise.

EXAMPLE 1

(Example according to the invention)

Preparation of a hydrophilic base

To 440 g of a dispersion contg. 21.5% of $TiO_2$ (average particle size 0.3–0.5 μm) and 2.5% of polyvinylalcohol in deionized water were subsequently added, while stirring, 250 g of a 5% polyvinyl alcohol solution in water, 105 g of a hydrolyzed 22% tetramethylorthosilicate emulsion in water and 12 g of a 10% solution of a wetting agent.

To this mixture was added 193 g of deionized water and the pH was adjusted to pH=4.

The obtained dispersion was coated on a polyethylene terephthalate film support having a thickness of 175 μm (having provided thereon a hydrophilic subbing layer) at a wet coating thickness of 50 g/m2, dried at 30° C. and subsequently hardened by subjecting it to a temperature of 57° C. for 1 week.

Preparation of the imaging element

Onto the above obtained lithographic base was coated a photosensitive composition consisting of a solution in methylethylketone of 8.50% by weight of a copolymer styrene/butylmethacrylate (Toner Resin OT 5154 from Degussa), 0.10% by weight of a blue dye (C.I. 61551), 1.00% by weight of 2,6-dinitrobenzyltosylaat and 0.50% by weight of thioxantone at a wet coating thickness of 37.5 μm.

The above obtained imaging element was overcoated with a solution consisting of a 20% by weight aqueous dispersion of Baystal KA 8522 (from Bayer AG, Germany) which is a copolymer containing styrene, butadiene and acrylic acid with a glass transition temperature of 34° C. (measured with the "1090 THERMOANALYZER" of Dupont Co.), a melt viscosity of more than 13420 Poise and an elasticity corresponding to a tg $\delta^{-1}$ value of 3.54, both last properties measured at 120° C. (with the "VISCOELASTIC MELT TESTER" of Rheometrics Co, UK) at a wet coating thickness of 30 g/m2.

Preparation and evaluation of the lithographic plate

On top of this imaging element and of those described below there was placed a test target with a 60 lines per cm screen as well as fine positive and negative lines, and the imaging element was exposed therethrough to ultraviolet radiation.

Each of the exposed imaging elements was then placed in face-to-face contact with the receptor element, being a subbed polyethylene terephthalte support (having an upper subbing layer contg. gelatine and silica).

The contacting elements were conveyed through a roll laminator device at 90° C. and at a speed of 0.3 m/min and the elements were peeled apart.

In this example the exposed parts of the photosensitive layer were removed and the unexposed areas remained on the lithographic base, thus being a positive working system.

With this sample, a good image was obtained with a line reproduction for lines of 12 μm.

The obtained image on the hydrophilic base could be used to print on a conventional offset press using a commonly employed ink and fountain. Good copies, free of stain were obtained.

EXAMPLE 2
(Example according to the invention)

An imaging element was prepared, exposed, laminated and peeled apart similar to the imaging element of example 1 except that the photosensitive layer was coated onto the hydrophilic base from a solution in methylethylketone of 8.00% by weight of a copolymer styrene/butylmethacrylate (Toner Resin OT 5154 from Degussa), 0.10% by weight of a blue dye (C.I. 61551), 1.50% by weight of 2,6-dinitrobenzyltosylaat and 0.50% by weight of thioxantone at a wet coating thickness of 37.5 μm.

In this example, the non-exposed parts of the photosensitive layer are removed and the exposed areas remain on the lithographic base, thus being a negative working system.

With this sample, a good image was obtained with a line reproduction for lines of 12 μm.

The obtained image on the hydrophilic base could be used to print on a conventional offset press using a commonly employed ink and fountain. Good copies, free of stain were obtained.

EXAMPLE 3
(Example according to the invention)

An imaging element was prepared, exposed, laminated and peeled apart similar to the imaging element of example 1 except that the photosensitive layer was coated onto the hydrophilic base from a solution in methylethylketone of 7.50% by weight of a copolymer styrene/butylmethacrylate (Toner Resin OT 5154 from Degussa), 0.10% by weight of a blue dye (C.I. 61551), 2.00% by weight of 2,6-dinitrobenzyltosylaat and 0.50% by weight of thioxantone at a wet coating thickness of 37.5 μm.

In this example, the non-exposed parts of the photosensitive layer are removed and the exposed areas remain on the lithographic base, thus being a negative working system.

With this sample, a good image was obtained with a line reproduction for lines of 12 μm.

The obtained image on the hydrophilic base could be used to print on a conventional offset press using a commonly employed ink and fountain. Good copies, free of stain were obtained.

EXAMPLE 4
(Example according to the invention)

An imaging element was prepared, exposed, laminated and peeled apart similar to the imaging element of example 1 except that the photosensitive layer was coated onto the hydrophilic base from a solution in methylethylketone of 8.50% by weight of a copolymer styrene/butylmethacrylate (Toner Resin OT 5154 from Degussa), 0.10% by weight of a blue dye (C.I. 61551), 1.00% by weight of di-(2-nitrobenzyl)-monomethoxyethyl phosphate and 0.50% by weight of thioxantone at a wet coating thickness of 37.5 μm.

In this example, the non-exposed parts of the photosensitive layer are removed and the exposed areas remain on the lithographic base, thus being a negative working system.

With this sample, a good image was obtained with a line reproduction for lines of 12 μm.

The obtained image on the hydrophilic base could be used to print on a conventional offset press using a commonly employed ink and fountain. Good copies, free of stain were obtained.

We claim:

1. A method for obtaining a lithographic printing plate comprising the steps of:

(a) image-wise or information-wise exposing a photosensitive imaging element comprising on a hydrophilic surface of a support a hydrophobic photosensitive layer contiguous to said hydrophilic surface, comprising (i) a photosensitive acid precursor and (ii) a hydrophobic polymeric binder and (b) developing said exposed imaging element by the steps of:

(i) laminating before or after said exposure an uppermost layer of said imaging element to a receptor layer and (ii) peeling away the receptor layer from the hydrophilic surface of the support thus transferring said hydrophobic photosensitive composition patternwise to the receptor layer, wherein said hydrophobic photosensitive layer comprises as photosensitive acid precursor a non-ionic photosensitive precursor of a sulphonic acid or a non-ionic photosensitive precursor of an optionally partially esterified phosphonic acid or a non-ionic photosensitive precursor of an optionally partially esterified phosphoric acid, the latter phosphonic or phosphoric acid precursors used in the absence of monomers capable of undergoing cationic polymerization.

2. A method according to claim 1 wherein said hydrophilic surface of a support is a hardened hydrophilic layer coated on a flexible support, containing (i) polyvinyl alcohol hardened with hydrolyzed tetraalkyl orthosilicate wherein the weight ratio between said polyvinylalcohol and said tetraalkyl orthosilicate is between 0.5 and 5 and (ii) siliciumoxide and/or titaniumdioxide.

3. A method according to claim 1 wherein said photosensitive acid precursor is a o-nitrobenzyl sulphonate.

4. A method according to claim 1 wherein said photosensitive acid precursor is a o-nitrobenzyl phosphonate or a o-nitrobenzyl phosphate.

5. A method according to claim 1 wherein said hydrophobic polymeric binder is a hydrophobic thermoplastic polymer.

6. A method according to claim 1 wherein said hydrophobic photosensitive layer has a dry weight in a range from 0.30 g/m$^2$ to 5.00 g/m$^2$.

7. A method according to claim 1 wherein the weight ratio of the photosensitive acid precursor to the polymeric binder in the hydrophobic photosensitive layer ranges from 5% to 40%.

8. A method according to claim 1 wherein the photosensitive imaging element comprises on top of the photosensitive layer at least one transfer layer which is capable of adhering to a receptor layer.

9. A method according to claim 8 wherein said transfer layer is a thermo-adhesive layer.

10. A method according to claim 8 wherein said transfer layer is a pressure-adhesive layer.

* * * * *